United States Patent [19]

Morse

[11] 4,025,716
[45] May 24, 1977

[54] DUAL IN-LINE PACKAGE WITH WINDOW FRAME

[75] Inventor: Robert S. Morse, La Mesa, Calif.

[73] Assignee: Burroughs Corporation, Detroit, Mich.

[22] Filed: Jan. 30, 1975

[21] Appl. No.: 545,387

[52] U.S. Cl. .............................. 174/52 FP; 29/627
[51] Int. Cl.² ........................................... H05K 5/06
[58] Field of Search ................ 174/DIG. 3, 52 S; 117/217; 29/627, 588, 591; 357/74

[56] References Cited

UNITED STATES PATENTS

| | | | |
|---|---|---|---|
| 3,404,319 | 10/1968 | Tsuji et al. | 174/52 FP X |
| 3,435,516 | 4/1969 | Kilby | 357/74 UX |
| 3,495,023 | 2/1970 | Hessinger et al. | 174/DIG. 3 UX |
| 3,502,786 | 3/1970 | Stoll | 174/52 FP |
| 3,509,430 | 4/1970 | Mroz | 174/DIG. 3 X |
| 3,535,486 | 10/1970 | Wood | 357/74 UX |
| 3,537,175 | 11/1970 | St. Clair et al. | 174/52 FP X |
| 3,698,073 | 10/1972 | Helda | 174/52 FP X |
| 3,793,064 | 2/1974 | Budd et al. | 117/217 |
| 3,809,797 | 5/1974 | McMunn et al. | 174/DIG. 3 X |

Primary Examiner—Bruce A. Reynolds
Assistant Examiner—D. A. Tone
Attorney, Agent, or Firm—Larry Michael Jarvis; Franklin D. Ubell; Kevin R. Peterson

[57] ABSTRACT

An integrated circuit package having a lead frame positioned between two lead glass layers on a ceramic base and a ceramic window frame bonded to the lead glass for accommodating a cap attached by a glass to gold to gold-tin eutectic bond. The various layers are applied by an advantageous combination of screen printing and fusing steps.

5 Claims, 1 Drawing Figure

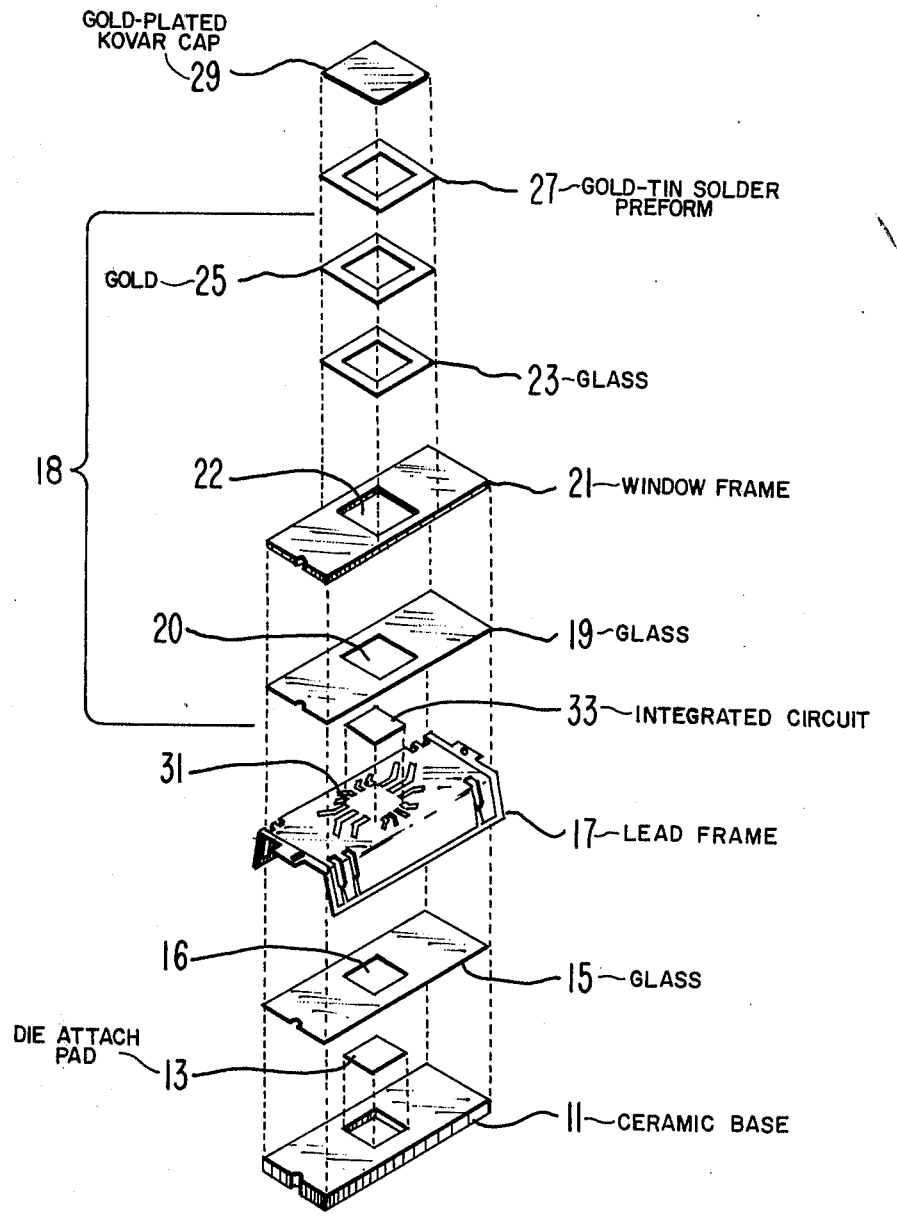

DUAL IN-LINE PACKAGE WITH WINDOW FRAME

BACKGROUND OF THE INVENTION

This invention relates in general to integrated circuit packages and specifically to a method and structure for sealing a ceramic dual in-line package. Numerous kinds of circuit package structures are known in the prior art. The problem has been to provide a package which is economical to fabricate and yet of high mechanical and electrical integrity. Recently, a particular dual in-line ceramic circuit package known as the "cerdip" package has proved to be particularly useful and reliable. Essentially, such a package includes a ceramic base bearing an integrated circuit chip, a lead glass layer screened on the base, a lead frame mounted upon the lead glass, and a ceramic lid bonded over the glass layer and lead frame. While the mechanical performance of such packages has been excellent, the integrity of the encapsulated circuitry has been adversely affected by the necessity of using temperatures between 450° and 465° C. in bonding the ceramic lid to the glass layer and lead frame.

It is, therefore, an object of the invention to provide an improved integrated circuit package and an improved method of fabricating such a package.

It is an additional object of the invention to encapsulate a ceramic dual in-line structure at temperatures which do not adversely affect integrated circuitry.

It is another object of the invention to modify a ceramic dual in-line package of the cerdip type to enable encapsulation at temperatures which do not adversely affect the packaged circuitry.

SUMMARY OF THE INVENTION

These and other objects and advantages of the invention are accomplished by a combination of deposition and heat sealing steps. A ceramic base is first provided for receiving an integrated circuit chip. A first lead glass layer is then deposited upon the ceramic base, and a lead frame is applied over the lead glass. Next, a glass layer and gold seal ring layer are applied to one side of a ceramic window frame. A second layer of lead glass is then applied and fixed to the other side of the ceramic window frame. The resulting window frame assembly is then bonded over the lead frame by fusing the two lead glass layers together. An integrated circuit chip may then be placed in connection with the lead frame and a cap bonded over the window using a gold-tin solder.

BRIEF DESCRIPTION OF THE DRAWINGS

FIG. 1 is an exploded view of the integrated circuit package of the preferred embodiment of the invention.

DETAILED DESCRIPTION OF THE PREFERRED EMBODIMENT OF THE INVENTION

As shown in FIG. 1, the integrated circuit package of the preferred embodiment of the invention includes a ceramic base 11, a die attach pad 13, a first lead glass layer 15, and a lead frame 17 mounted on the first lead glass layer 15. Bonded over the lead frame 17 is an intermediate assembly 18 including a lead glass layer 19, a window frame 21, a glass layer 23 and a gold seal ring 25. This intermediate assembly 18 surrounds an integrated circuit chip 33, which is bonded to the die attach pad 13 and connected to the lead frame 17. The package is closed by a cap 29 bonded to the gold seal ring 25 by means of a gold-tin solder ring preform 27.

In fabricating the printed circuit package of the preferred embodiment of the invention, the die attach pad 13 is first applied to the ceramic base 11. The lead glass layer 15 is then screened printed on the ceramic base 11 and air fired, leaving an aperture 16 for conneting the integrated circuit chip 33. The lead frame 17, formed by conventional techniques, is then positioned on the screened lead glass layer 15 and fused into place.

Next, rather than fusing a ceramic lid over the integrated circuit chip as in the prior art, the intermediate assembly 18 is fabricated. In this operation, a glass layer 23 is screen printed around the window 22 and air fired. Then the pure gold seal ring 25 is screen printed on the glass layer 23 and air fired. Finally, the lead glass layer 19 is screen printed on the window frame 21 and the entire assembly 18 is again air fired.

The resulting window frame assembly 18 including the frame 21 and the three layers 19, 23, 25 is then bonded to the base 11 over the lead frame 17. The lead glass layer 19 is placed over the lead frame 17 and heat is applied to fuse the lead glass layers 15, 19. In fusing lead glass, it is important to maintain the temperature between 480° and 500° C. Otherwise, devitrification and loss of glass fluidity would result. As indicated, all of the operations thus far detailed may be conducted in an air atmosphere.

After these operations, the integrated circuit chip 33 is mounted through the apertures 16, 20, 22 by scrubbing to the pad 13 and connected to the exposed leads 31 of the lead frame 17. With the chip in place, the solder ring preform 27 is placed on the screened gold seal ring 25 and the cap 29 is situated on the solder ring 27. The package is then heated in a nitrogen atmosphere at a temperature of 320° C. Allowing for heat loss, the package temperature is thereby raised to the melting point of gold-tin alloy, nominally 280° C. At this temperature the solder ring 27 melts, forming a hermetic seal between the cap 29 and the gold seal ring 25 without serious adverse effect on the integrated circuitry on the chip 33.

Several structural features of the package are notable. In the preferred embodiment, the cap 29 is gold-plated Kovar. If desired, the cap could also be fabricated of ceramic material. Additionally, the use of a glass, gold, gold-tin seal accomodates the fact that gold does not adhere well to ceramic and that gold-tin alloy best adheres to pure gold. Overall, the particular package structure and combination of printing and heating steps provide a commercially feasible circuit package.

As is apparent, modifications in the structure and technique of the preferred embodiment of the invention may be made by one of ordinary skill in the art without departing from the scope of the invention. Therefore, it is to be understood that, within the scope of the appended claims, the invention may be practiced other than as specifically described.

What is claimed is:

1. An electronic device package having a ceramic base for receiving an integrated circuit chip; a first lead glass layer selectively deposited and fixed on said base; and a lead frame fused in position on said lead glass layer at a selected temperature range; in combination, the improvement comprising means facilitating the encapsulation of an integrated circuit on said base at a second relatively lower temperature range than said selected temperature range by a cover member, said means including:

a ceramic window frame substantially coextensive with the top surface of said ceramic base for fusement thereover at substantially the said selected temperature range to present a flat planar surface for maintaining the lead frame fuse in position on said base and for providing a protection layer substantially over the entire surface of said lead frame, said window frame having a window centrally formed therein of a size to receive an integrated circuit chip;

a second lead glass layer selectively deposited on the underside of window frame, said second glass layer securing said ceramic window to said top surface of said ceramic base sandwiching said lead frame between said window frame and said top surface of said ceramic base; and means for fusing a cover member over said window at said second relatively lower temperature range to protect the electrical integrity of the chip, said means including a gold ring deposited and fixed on the other side of said ceramic window frame circumscribing and contiguous to said window.

2. In the art of manufacturing an integrated circuit package, said package comprising a ceramic base having a first lead glass layer selectively deposited on the top surface of the base and having a lead frame fused in position on the first lead glass layer, a method of preparing the package to encapsulate an integrated circuit chip comprising the steps of:

forming an intermediate window frame subassembly by forming an intermediate ceramic window frame substantially coextensive with the top surface of a ceramic base of an electronic package;

forming a window centrally located in said frame of a size to receive an integrated circuit chip;

selectively depositing a second lead glass layer on the underside of said window frame;

depositing a gold ring layer around the perimeter of said window on the other side of said window frame permitting the integrated circuit chip to be encased by a cover means adapted to be secure on said gold ring at a first selected temperature range protecting the electrical integrity of the chip;

placing said intermediate window frame subassembly over a lead frame fused in position on a first lead glass layer deposited on the top surface of the ceramic base thereby aligning said window of said window frame to permit the lead frame to electrically receive the integrated circuit mounted through said window; and fusing together the first and said second lead glass layers at a second relatively higher temperature range than said first range, thereby sandwiching the lead frame therebetween.

3. The method of claim 2, and further including the step of encapsulating an integrated circuit chip within said package by securing an integrated circuit to the base and in appropriate electrical connection with the lead frame; applying a solder ring preform to said gold ring layer; positioning a cap on said solder ring preform; and heating at said first selected temperature range said package in a nitrogen atmosphere to hermetically seal the cap to said gold ring.

4. The method of encapsulating an integrated circuit according to claim 3 wherein said first temperature range is at an approximate temperature of 320° centigrade and said second temperature range is at 480°–500° centrigrade.

5. The method of manufacturing an integrated circuit package comprising the steps of:

forming a ceramic base adapted to receive an integrated circuit chip;

selectively depositing a lead glass layer on the top surface of said base;

fusing a lead frame in position on the first lead glass layer in a registration permitting electrical interconnection of a chip when mounted therein;

forming a ceramic window frame substantially coextensive with the top surface of said base;

forming a window centrally located in said frame of a size to recieve an integrated circuit chip;

selectively depositing a second lead glass layer on the underside of said window frame;

placing said window frame coextensively over said lead frame for aligning said window of said window frame to permit the lead frame to electrically recieve the integrated circuit chip mounted through said window;

fusing together said first and said second lead glass layers at a first selected temperature range, sandwiching the lead frame therebetween; and depositing a gold ring layer around the perimeter of said window on the other side of said window frame permitting the integrated circuit chip to be encased by a cover means adapted to be secured on said gold ring at a second selected temperature range lower than said first selected temperature range for protecting the electrical integrity of the chip.

* * * * *

UNITED STATES PATENT OFFICE
CERTIFICATE OF CORRECTION

PATENT NO. : 4,025,716
DATED : May 24, 1977
INVENTOR(S) : Robert S. Morse

It is certified that error appears in the above-identified patent and that said Letters Patent are hereby corrected as shown below:

Column 2, line 4, "screened" should be --screen--;
line 5, "conneting" should be --connecting--;
Column 3, line 5, "fuse" should be --fused--;
line 12, after "of" insert --said--;
line 13, after "window" insert --frame--;
Column 4, line 33, "recieve" should be --receive--;
line 39, "recieve" should be --receive--.

Signed and Sealed this thirtieth Day of August 1977

[SEAL]

Attest:

RUTH C. MASON
Attesting Officer

C. MARSHALL DANN
Commissioner of Patents and Trademark